US009000862B2

(12) United States Patent
Richley et al.

(10) Patent No.: US 9,000,862 B2
(45) Date of Patent: Apr. 7, 2015

(54) ISOLATION DEVICES THAT PASS COUPLER OUTPUT SIGNALS

(75) Inventors: Edward A. Richley, Gaithersburg, MD (US); Daniel F. Donato, Johnsburg, IL (US)

(73) Assignee: ZIH Corp., Lincolnshire, IL (US)

( * ) Notice: Subject to any disclaimer, the term of this patent is extended or adjusted under 35 U.S.C. 154(b) by 428 days.

(21) Appl. No.: 13/401,544

(22) Filed: Feb. 21, 2012

(65) Prior Publication Data

US 2012/0212306 A1 Aug. 23, 2012

Related U.S. Application Data

(60) Provisional application No. 61/445,016, filed on Feb. 21, 2011.

(51) Int. Cl.

| | |
|---|---|
| ***H01P 5/00*** | (2006.01) |
| ***H01P 1/30*** | (2006.01) |
| ***H01P 7/06*** | (2006.01) |
| *H05K 5/04* | (2006.01) |

(52) U.S. Cl.
CPC ... *H01P 1/30* (2013.01); *H01P 7/06* (2013.01)

(58) Field of Classification Search
CPC .................................... H01P 5/00; H05K 5/04
USPC ...... 333/24 R, 24 C, 246; 343/872, 905, 906; 361/119, 142, 679.01
See application file for complete search history.

(56) References Cited

U.S. PATENT DOCUMENTS

| | | | | |
|---|---|---|---|---|
| 4,053,855 | A | 10/1977 | Kivi et al. | |
| 4,166,256 | A | 8/1979 | Shishido | |
| 4,887,180 | A | 12/1989 | Climent et al. | |
| 7,057,577 | B1 * | 6/2006 | Willoughby et al. | 343/906 |
| 8,027,136 | B2 * | 9/2011 | Penwell et al. | 361/119 |
| 8,456,791 | B2 * | 6/2013 | Jones et al. | 361/119 |
| 2004/0113635 | A1 * | 6/2004 | Masuda et al. | 324/672 |
| 2007/0028829 | A1 | 2/2007 | Griessbaum et al. | |
| 2009/0103226 | A1 * | 4/2009 | Penwell et al. | 361/119 |

FOREIGN PATENT DOCUMENTS

| | | | |
|---|---|---|---|
| EP | 0 296 054 | A1 | 12/1988 |
| JP | 63 149901 | A | 6/1988 |

OTHER PUBLICATIONS

International Search Report and Written Opinion for Application No. PCT/US2012/025944 dated Jul. 20, 2012.

* cited by examiner

*Primary Examiner* — Dean Takaoka

(74) *Attorney, Agent, or Firm* — Alston & Bird LLP

(57) ABSTRACT

Various embodiments are directed to isolation devices, systems, methods and various means, for isolating ignition causing signals and/or explosions from hazardous or explosive environments.

20 Claims, 6 Drawing Sheets

ISOLATION DEVICES THAT PASS COUPLER OUTPUT SIGNALS

CROSS-REFERENCE TO RELATED APPLICATIONS

The present application claims priority to U.S. Provisional Application No. 61/445,016 filed Feb. 21, 2011, which was entitled Waveguide Isolator; the contents of which is incorporated herein in its entirety.

FIELD

Embodiments of the present invention relate generally to communications systems and, more particularly, relate to methods, apparatuses, systems and other means for isolating potentially dangerous stimuli from potentially hazardous environments.

BACKGROUND

It can be hazardous in certain environments for an electrical circuit or system to produce a spark or other thermal effect. For example, a spark or thermal effect produced in an atmosphere of explosive gas could cause an explosion that could cause personal harm and damage to property.

Various regulations exist (e.g., International Electrotechnical Commission regulations, ATEX directives, etc.) that provide specifications under which "safe circuits" may be designed. These safe circuits are designed to ensure that any sparks or other thermal effects produced by the circuit in the conditions specified within the standards, which include normal operation and specified fault conditions, are not capable of causing ignition of a given gas atmosphere.

The above specifications further require that an intrinsically safe barrier or enclosure be provided to house the safe circuit. The enclosure is designed to withstand the maximum anticipated force of an explosion occurring within the enclosure. One example prior art intrinsically safe barrier is disclosed by U.S. Pat. No. 7,057,577, which is assigned on its face to Ventek LLC.

Applicant has identified a number of deficiencies and problems associated with the design, manufacture, use, and maintenance of conventional safe circuits and intrinsically safe barriers. Through applied effort, ingenuity, and innovation, Applicant has solved many of these identified problems by developing a solution that is embodied by the present invention, which is described in detail below.

SUMMARY

Various embodiments of the invention are directed to an isolation device configured to transmit a signal from an isolated component (e.g., electronic circuitry) positioned within an environmental enclosure (e.g., an explosion proof box) to an exposed component (e.g., an antenna) positioned outside the environmental enclosure. Additionally or alternatively, the isolation device may be configured to transmit a signal from the exposed component to the isolated component.

The isolation device comprises a protective housing including a wave coupler chamber. In some embodiments, the wave coupler chamber may be defined by the protective housing while in other embodiments the wave coupler chamber may be defined by a separate structure or enclosure positioned within the protective housing.

The isolation device includes a transmission coupler positioned within the wave coupler chamber that is configured to transmit an electromagnetic wave into the wave coupler chamber following receipt of an input signal generated by one of the exposed component or the isolated component. The isolation device also includes a reception coupler positioned within the wave coupler chamber that is configured to transmit a coupler output signal to the other of the exposed component or the isolated component upon receipt of the electromagnetic wave.

In some embodiments, the isolation device may comprise a dielectric that at least partially fills the wave coupler chamber. The dielectric may be a potting resin, epoxy encapsulant, or other similar material.

The protective housing of the isolation device may be mounted to the environmental enclosure such that a first portion of the housing extends within the environmental enclosure and a second portion of the housing extends outside of the environmental enclosure. For example, in one embodiment, the protective housing may define external threads that are configured to engage the environmental enclosure. In other embodiments, the protective housing may be completely enclosed by the environmental enclosure.

In some embodiments, the isolation device is configured to transmit a coupler output signal at a frequency between 4 GHz and 8 GHz, preferably between 6 GHz and 7 GHz, and more preferably between 6.3 GHz and 7 GHz. In one embodiment, the isolation device is configured to transmit a coupler output signal at a signal loss of less than 0.7 dB, when compared to the input signal, at a frequency between 6.3 GHz and 7 GHz.

BRIEF DESCRIPTION OF THE SEVERAL VIEWS OF THE DRAWING(S)

Reference will now be made to the accompanying drawings, which are not necessarily drawn to scale, and wherein.

DETAILED DESCRIPTION

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Electrical devices, components, and systems are used today in all manner of environments. Some environments contain flammable, combustible, or explosive gases, vapors, liquids, chemicals, dusts, or other particulate (referred to collectively herein as "explosive environments"). It is important in such an explosive environment that electrical signals be transmitted to and from any local electrical devices, components, or systems without creating sparks, or other thermal effects, which could ignite the explosive environment.

Figure 1A:
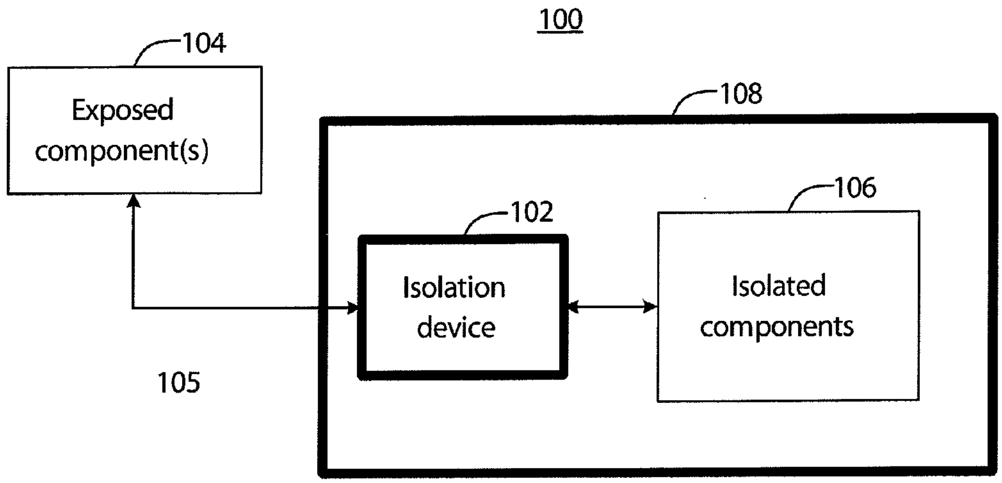
FIGS. 1A and 1B show block diagrams of exemplary isolation systems in accordance with some embodiments discussed herein.

FIG. 1A shows an isolation system 100 positioned within an explosive environment 105. The isolation system 100 comprises an exposed component 104, isolated components 106, an isolation device 102, and an environmental enclosure 108.

The depicted isolation system 100 is a wireless communication system, for example, an Ultra-Wideband ("UWB") Real Time Locating System (RTLS) that can be used to provide precision locating and real-time tracking of one or more (even thousands of) assets and/or personnel in many types of environments, including the depicted explosive environment 105. The depicted wireless communication system is not limited to a UWB RTLS, and may be any type of system, including a system compliant with one or more of the IEEE 802 standards (including WiFi), mobile phone standards (e.g., CDMA2000, 3GPP Long Term Evolution ("LTE") Advanced, Global System for Mobile ("GSM") communications, Universal Mobile Telecommunications System ("UMTS"), etc.), among others.

The depicted isolation system 100 includes exposed components 104 that are antenna elements configured to wirelessly communicate with various devices (not shown), including radio frequency identification ("RFID") tags and other communication devices, cellular phones, mobile computing devices, and the like. In other embodiments, the isolation system 100 may also or instead be configured to communicate using non-wireless protocols and/or components. For example, some embodiments may be configured to pass alternating current modulated signals to wired ports, such as those used for high frequency gigabit serial communications, and/or to facilitate the transfer of optical signals. The foregoing description refers to an example UWB wireless system for illustration purposes; however, one of ordinary skill in the art will readily appreciate that the inventive concepts herein described are not limited to use in a UWB wireless system and may be used in any system where isolation is desired between an exposed component, which is positioned in an explosive environment, and one or more isolated components.

The depicted isolation system 100 comprises an isolation device 102, which is disposed in electrical communication with the exposed component(s) 104 (e.g., an antenna) and the isolated components 106. An environmental enclosure 108 encloses the isolation device 102 and the isolated components 106.

The isolation device 102 is configured to receive an input signal and to pass one or more predetermined types of signals, while blocking high voltage signals and/or other faults that may ignite the explosive environment 105. For example, in one embodiment, power entering the environmental enclosure 108 may be 220V alternating current and the isolation device 102 may be configured to prevent an accidental fault from carrying the 220V alternating current (at 50 or 60 hertz) out of the environmental enclosure 108 to the exposed component 104 where such escaping current may cause an explosion.

In some embodiments, isolation device 102 can be configured to pass electrical signals that are generated by isolated components 106 and represent, for example, radio frequency signals for eventual transmission to an antenna of exposed component(s) 104. Such signals may be passed among the components of isolation system 100 via a coaxial cable and/or any other type of signal carrying medium. In one preferred embodiment, isolation device 102 may pass electrical signals having frequencies within the IEEE C-band (i.e., frequencies ranging between 4.0-8.0 gigahertz ("GHz")) and/or any other band of frequencies with relatively minor power loss (e.g., less than 0.7 decibels ("dB")) at those frequencies. Isolation device 102 can also be configured to block, for example, direct current signals and/or low frequency alternating current signals (e.g., line voltage signals), which have the potential to exceed a safe level, without introducing an unacceptable amount of loss to desired input signal.

As will be appreciated by one of skill in the art in view of this disclosure, the isolation device 102 is bi-directional and is not limited to receiving signals generated by the isolated components 106. Indeed, in accordance with various embodiments, signals may be generated by the exposed component(s) 104 and transmitted through the isolation device 102 to the isolated components 106.)

Isolation device 102 may be located internal to (FIG. 1A) or physically mounted to (FIG. 1B) environmental enclosure 108. For example, in reference to FIG. 1B, the isolation device 102 may include a mounting component (such as external threads) that allow it to be mounted within or to (e.g., screwed into) and/or removed from environmental enclosure 108. Any type of suitable mounting component(s) may be defined by or affixed to isolation device 102 and/or environmental enclosure 108.

The depicted exposed components 104 comprise, for example, any type of suitable wireless antenna or antennae, a protective cover, and one or more mounting components (that enable one or more of the antenna components 104 to be mounted to, e.g., environmental enclosure 108). The exposed components 104 may also comprise one or more physical connectors (e.g., Ethernet port, serial bus port, firewire port, etc.). For example, in one embodiment, the exposed components 104 may include a UWB antenna enclosed in a plastic protective cover (not shown) that is coupled to the protective environmental 108 with a hinged mounting component (not shown).

Isolated components 106 can include, for example, any type of circuitry, such as a transceiver, battery, memory, processor, communications circuitry, among other things. In the depicted embodiment, the isolated components 106 are configured to receive and/or transmit data signals using the antenna(e) of the exposed components 104. Isolated components 106 may also be used to process and/or generate data signals.

Environmental enclosure 108 may be any type of protective housing that is configured to isolate the isolated components 106 from the explosive environment 105 by reducing or eliminating ignition emissions from the enclosure 108 such as, without limitation, electrical pulses/surges, sparks, thermal effects, magnetic fields, electromagnetic radiation, and chemical agents. The environmental enclosure 108 also is designed to serve as an explosion proof barrier such that any explosion occurring within the enclosure 108 is isolated from the explosive environment 105. For example, in some embodiments, the environmental enclosure 108 may be gas tight and designed to withstand a hydraulic pressure test of at least 600 psi. Finally, in still other embodiments, the environmental enclosure 108 and/or isolation device 102 can also be configured to prevent damage to the isolated components 106 from the explosive environment 105, e.g., vapors, fumes, moisture, magnetic fields, electromagnetic radiation, electrical pulses/surges, etc.

Hardware and other gas tight fittings known in the art may be used to retain cables or other signal carrying mediums that breach the environmental enclosure and electrically couple the isolation device 102 of FIG. 1A to the exposed component(s) 104. One example such fitting is the cable gland type ICG 623 fitting distributed by Hawke International. Without such fittings, as will be appreciated by on of ordinary skill in the art, an explosion occurring within the environmental enclosure 108 may escape to the explosive environment 105.

Figure 1B:
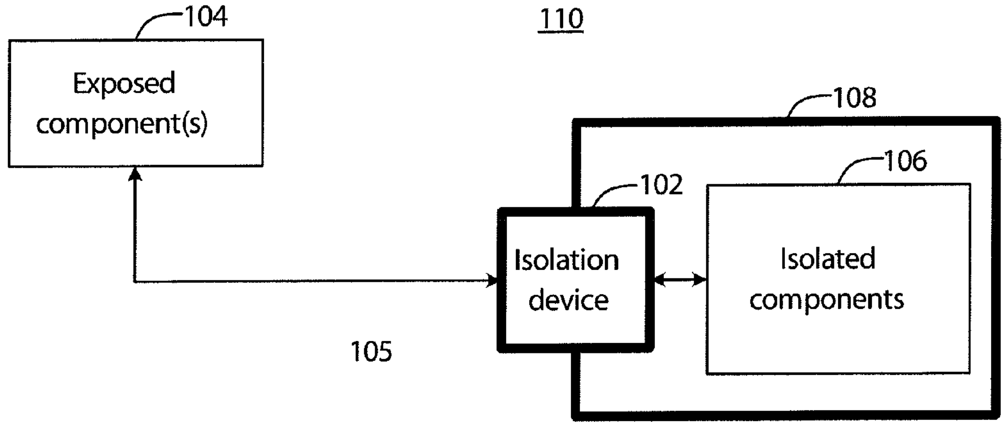

The embodiment of FIG. 1B provides an advantage verses that of FIG. 1A in that the isolation device 102 of FIG. 1B provides both electrical isolation of any surges, etc., produced by the exposed components or the isolated components and explosion proof protection. Said differently, no cable gland type fitting is necessary for the connection between the isolation device 102 and the exposed component 104 as the isolation device 100 itself supports this explosion proof function.

In still other embodiments, which are not shown here but may be apparent to one of ordinary skill in the art in view of this disclosure, the isolation device may be a combined isolation device (such as, e.g., isolation device 102 of FIG. 1A) and environmental enclosure (such as, e.g., environmental enclosure 108 of FIG. 1A). For example, rather than an isolation device that is removably mounted to (e.g., screwed into) an environmental enclosure, isolation device may be integrally formed with the environmental enclosure (e.g., formed with, cast with, welded to, etc.).

U.S. Pat. No. 7,057,577 discloses a capacitive block circuit isolator structured in accordance with the known prior art. The disclosed capacitive block circuit includes a first connector (e.g., an SMA connector), one or more PCB traces, two capacitors placed in series, and second connector. Notably, electrical signals passing through the capacitive block circuit isolator experience losses due to the connections between the connectors, traces, and capacitors. Such losses are exacerbated at high frequencies where both the physical size and material properties of high voltage capacitors tend to undermine the low-loss transmission goal.

Figure 2A:
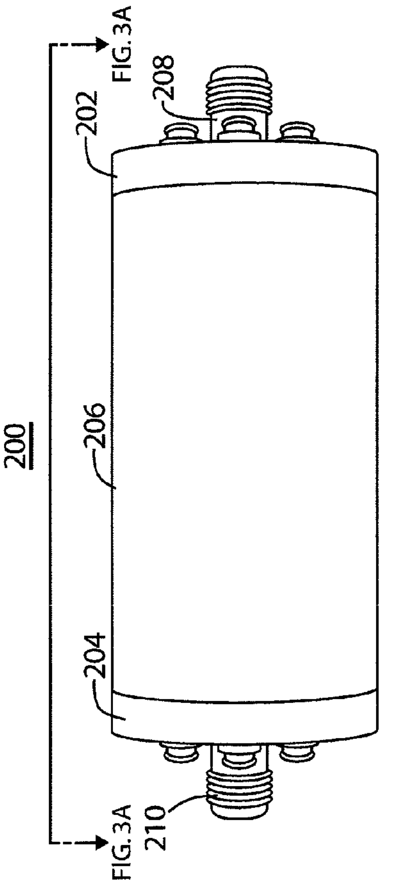
FIG. 2A is a perspective view of an isolation device structured in accordance with some embodiments discussed herein.
Figure 2B:
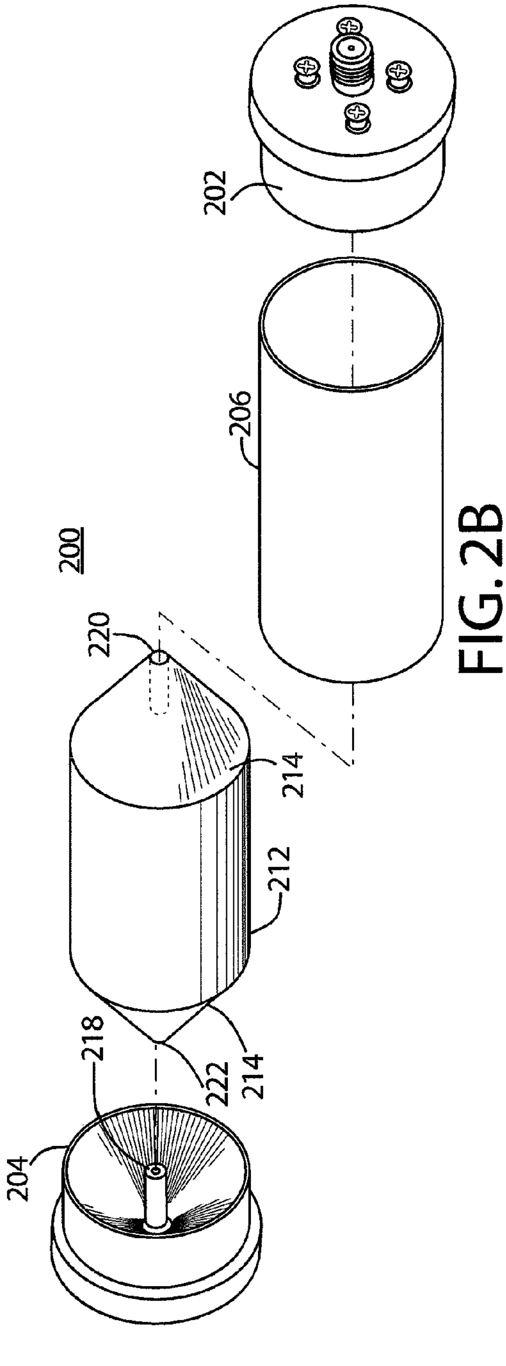
FIG. 2B is an exploded view of the isolation device of FIG. 2A.

FIGS. 2A and 2B show an exemplary isolation device 200 in accordance with some embodiments of the present invention. FIG. 2A is a perspective view of an assembled isolation device 200 while FIG. 2B is an exploded view of the isolation device 200. The isolation device 200 is an example of an isolation device, such as isolation device 102 of FIG. 1A, that may be enclosed within an environmental enclosure, such as environmental enclosure 108 of FIG. 1A.

The depicted isolation device 200 comprises a wave coupler, and more particularly, a cylindrical waveguide, for transmitting signals across the isolation device 200 while ensuring that such signals are of a type sufficient to avoid causing sparks or other undesirable effects. For purposes of the present specification and appended claims, the term "wave coupler" refers to a structure or system for carrying electromagnetic waves (i.e., energy) from one point to another that is designed to confine the electromagnetic waves from an external environment. While a cylindrical waveguide is illustrated here, in other embodiments, as will be apparent to one of ordinary skill in the art in view of this disclosure, other wave coupler structures may be used including other types of waveguides such as, without limitation, rectangular waveguides, flexible waveguides, etc., and other structures that transmit electromagnetic waves within a conductive (or conductively plated) enclosure such as, but not limited to, resonant cavities of the type illustrated by FIG. 6.

The isolation device 200 of FIG. 2A/2B comprises a first end portion 202, a second end portion 204, and a cylindrical center portion 206. When assembled, the center portion 206 is located between the first end portion 202 and the second end portion 204 as shown in FIG. 2A. Isolation device 200 further includes one or more connectors, such as first connector 208 and second connector 210. In some embodiments, one or more of the connectors can be coupled to or formed with the first end portion 202 and/or second end portion 204. In the depicted embodiment, the connectors 208, 210 are bulkhead mount coaxial cable connectors that are fastened to first end portion 202 and second end portion 204 via screws. In other embodiments, other types of connectors 208, 210 may be used that are fastened to or integrally formed with the first end portion 202 and/or the second end portion 204.

First connector 208 and/or second connector 210 may be configured to receive and/or transmit an "input signal" generated by an isolated component or an exposed component. The term "input signal" as used herein refers to a signal that has not yet passed into the isolation device and thus may contain undesirable aspects (e.g., high voltages, etc.).

In the depicted embodiment, first connector 208 may function as an input port that receives an input signal from a cable (such as a coaxial cable) or other signal carrying medium connected thereto. The signal carrying medium may be connected to isolated components, such as isolated components 106 of FIG. 1A.

Isolation device 200 can be configured (i.e., constructed and tuned) to pass only "coupler output signals" that are unlikely to ignite a surrounding explosive environment. The term "coupler output signal" refers to a signal that has passed through the wave coupler of the isolation device. As discussed in greater detail below, depending on the type of wave coupler (e.g., waveguide, resonant cavity, etc.) used, various physical and electrical circuit design features (e.g., waveguide cutoff frequency, direct current short-to-ground circuit, etc.) may operate to isolate ignition causing signals or components of signals and pass only the more-desirable coupler output signals.

In some embodiments, first end portion 202, second end portion 204 and center portion 206 can be secured into a single unit that cannot be separated or otherwise taken apart without damaging isolation device 200. For example, first end portion 202 and second end portion 204 can be soldered, welded, screwed to using reciprocally formed threads and/or otherwise attached to center portion 206 (including either end portion being formed integrally with the center portion as a single piece or casting). In other embodiments, at least two of first end portion 202, second end portion 204, and center portion 206 can be separable from one another without cutting, breaking or otherwise damaging isolation device 200. In various embodiments, when assembled the first end portion 202, the second end portion 204, and the center portion 206 combine to form a gas tight protective (e.g., explosion proof) housing, which may be wholly or partly enclosed within the environmental enclosure 108 discussed above in connection with FIGS. 1A and 1B.

In some embodiments, such as those discussed in connection with FIG. 1B, the protective housing of FIGS. 2A and 2B may be equipped with external threads (not shown) that are configured to engage an aperture of the environmental enclosure. In such embodiments, the protective housing may be screwed into an external wall of the environmental enclosure such that the isolation device provides the means by which the coupler output signals breach the environmental enclosure. Said differently, the protective housing of the isolation device provides an explosion proof barrier that reduces or eliminates the need for a cable gland type fitting of the type discussed above.

FIG. 2B depicts an exploded view of isolation device 200 with first end portion 202, second end portion 204, and center portion 206 separated from each other (e.g., before being assembled as shown in FIG. 2A). The depicted isolation device 200 includes a first coupler 216 (e.g., waveguide transmission/reception probe) extending from the first end portion 202 and a second coupler 218 (e.g., waveguide transmission/reception probe) extending from the second end portion 204. As will be apparent to one of ordinary skill in the art, the center portion 206 combines with the first end portion 202 and the second end portion 204 to define a sealed wave coupler chamber. Various aspects of the wave coupler chamber (e.g., in waveguide examples—the length of the waveguide, the internal shape of the first end portion, the second end portion, and the center portion, the length and shape of the couplers, the use or presence of iris filters or other structures within the waveguide, etc.; in resonant cavity examples, the position of the tuning rod, the shape of the cavity body, etc.) are configured or tuned in order to reduce signal loss and to properly configure the wave coupler for its filter function.

In the depicted embodiment, the wave coupler is a "filled waveguide" and, thus, a dielectric 212 is provided to at least partially fill the internal cavity formed by the center portion 206, the first end portion 202, and the second end portion 204. In some embodiments, the dielectric may be selected to reduce signal loss and to assist in configuring the wave coupler for its filter function. The depicted dielectric 212 is an acrylic; however, in alternative embodiments, other dielectrics may be used such as potting resins that are poured as a liquid or semi-solid into the wave coupler thereby conforming to its internal shape. In still other embodiments, the wave coupler of the isolation device 200 may be filled with gases such as air, nitrogen, argon, and the like.

Potting resins or epoxy encapsulants and other similar dielectrics (e.g., materials having a relative dielectric constant greater than 1) may be useful in isolation device embodiments that, for example, need to be gas tight to very high pressures. In such embodiments, the potting resins or epoxy encapsulants may assist in ensuring that the protective housing is gas tight and may further enhance the explosion proof capabilities of the housing. Use of dielectric materials further allows for the wave coupler to be reduced in size.

The depicted dielectric 212 conforms to the internal shape of the wave coupler chamber formed by the center portion 206, the first end portion 202, and the second end portion 204. In particular, the depicted dielectric 212 defines a cylindrical center with convex, flat-tipped conical ends 214. The convex ends of the dielectric 212 conform to concave cavities defined proximate the couplers 216, 218 in the first and second end portions 202, 204. Cavities 220, 222 are defined at opposite ends of the dielectric 212 for receiving the couplers 216, 218.

Figure 6:
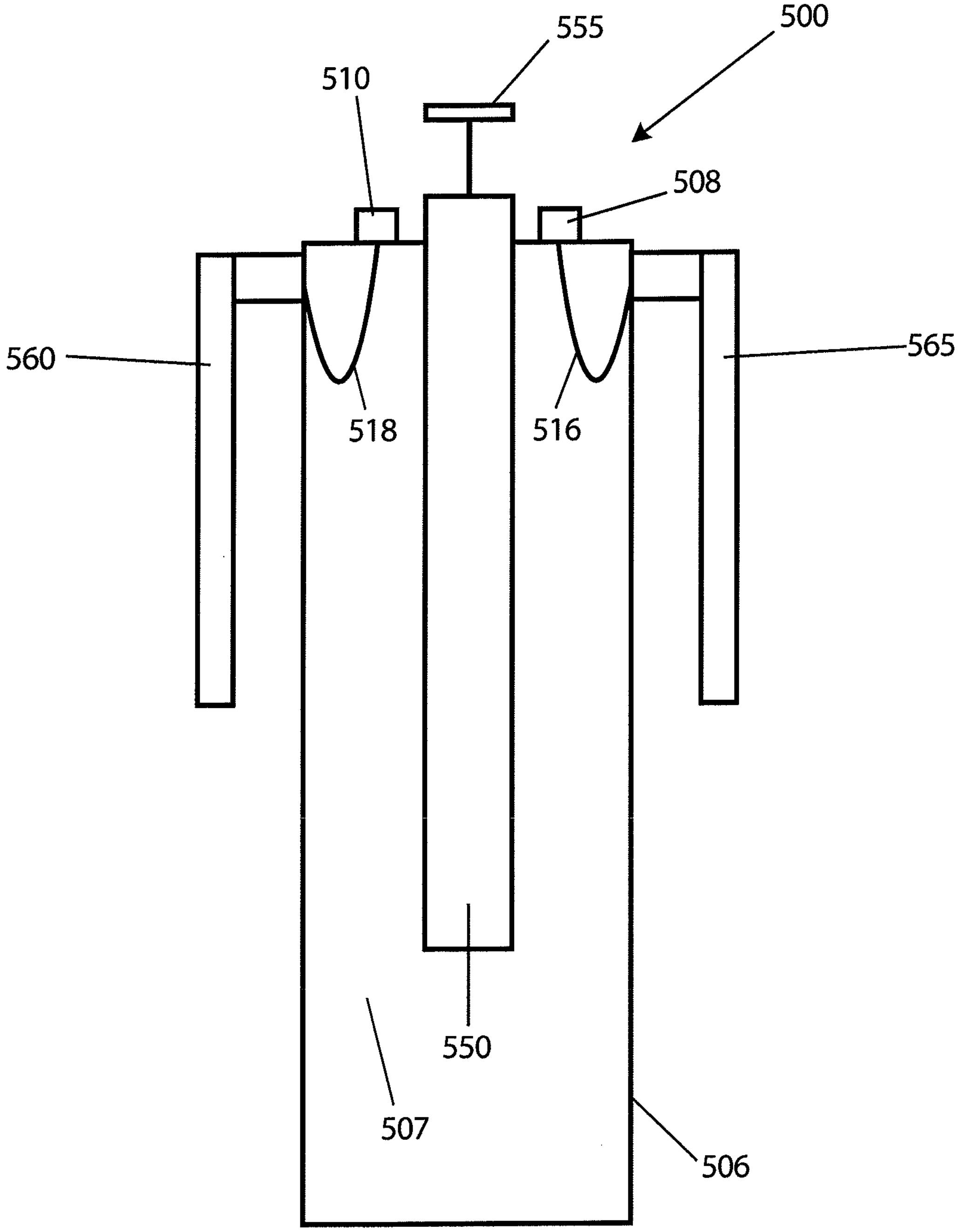
FIG. 6 is a schematic illustration of an isolation device having a resonant cavity wave coupler structured in accordance with another embodiment of the invention.

In one embodiment, the internal surfaces of the first end portion 202, the second end portion 204, and the center portion 206 are designed, shaped, and tuned to optimize transmission and/or reception of desired signals from coupler 216 through dielectric 212 to coupler 218 (and/or vice-versa), while blocking undesirable signals. Coupler 216 and/or coupler 218 can be various sizes and shapes, including that of a loop (as shown in FIG. 6), and/or any other suitable shape(s) and/or size(s) as may be required for optimal wave coupler design. Coupler 216 may function as a transmission antenna (e.g., transmission probe) and coupler 218 may function as a receiving antenna (e.g., reception probe) or vice-versa.

In some embodiments, in order to provide intrinsic safety via infallible spacing and/or to provide the proper isolation, the various sizes (e.g., center portion 206's inner circumference, center portion 206's outer circumference, length of couplers 216 and 218, etc.), shapes (e.g., outer shape(s), inner shape(s) of various components, etc.), composition (e.g., material(s), etc.) and other characteristics of isolation device 200, including those relating to dielectric 212 between and/or around couplers 216 and 218, can be configured such that isolation device 200 only passes coupler output signals (i.e., post wave coupler signals or derivative signals) that are suitable to be passed outside an environmental enclosure (e.g., safe, within predetermined tolerance levels, and/or nondestructive), while also blocking unsuitable input signals or unsuitable characteristics of input signals (e.g., unsafe voltages, noise, interference, among others) regardless of originating point.

In some embodiments, the isolation device 200 may be configured to meet particular industry standards, such as those outlined in the International Electrotechnical Commission ("IEC") standards (e.g., IEC 60079-0 through IEC 60079-14), ATEX directives, and other similar U.S. and foreign standards or regulations, to isolate certain components (e.g., the isolated components) from a potentially hazardous environment (e.g., the explosive environment). More specifically, should the isolated components malfunction, spark, generate a voltage surge, become hot, etc., then such ignition event would be limited to the environmental enclosure and isolated from the explosive environment. In one embodiment, for example, an unexpected voltage surge may be isolated from an exposed antenna component, thus limiting the ability of such voltage surge from causing ignition of the explosive environment surrounding the antenna.

Isolation device 200 can be comprised of one or more suitable materials. For example, first end portion 202, second end portion 204 and center portion 206 may be at least mostly comprised of silver-plated brass, copper and/or any other conductive material(s). In some embodiments, the first end portion 202, the second end portion 204, and the center portion 206 may be made from a base material that provides adequate strength to withstand the high gas pressures needed to support explosion proofing (e.g., stainless steel, etc.), however, may also be internally plated or coated with a more conductive metal (e.g., silver, copper, etc.) to support wave coupler functionality.

Although first end portion 202 and second end portion 204 may be mostly conductive, one or more suitable dielectric materials may be used to electrically and/or otherwise isolate couplers 216 and 218 from other parts of first end portion 202 and second end portion 204 to prevent shorting. However, in alternative embodiments, such as that depicted in FIG. 6, at least a portion of the coupler may be grounded to a conductive wall of the protective housing as will be discussed in greater detail below. In various embodiments, the protective housing (i.e., the first end portion 202, the second end portion 204, and the center portion 206) can function as a wave coupler chamber and as an outer ground plate thereby isolating the transmitted electromagnetic waves from electromagnetic noise, among other things.

Figure 3A:
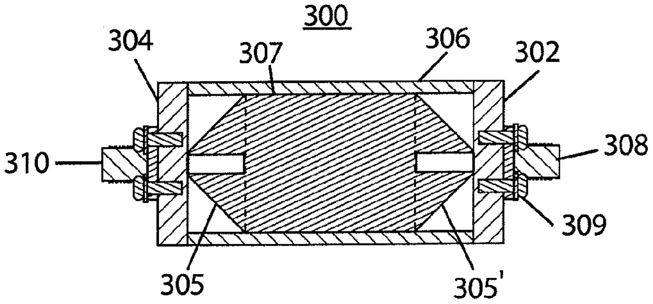
FIG. 3A is a section view of the isolation device of FIG. 2A, taken along section lines 3A-3A.

FIG. 3A is a section view of an isolation device 300 structured in accordance with one embodiment. The isolation device 300 comprises a first end portion 302, a second end portion 304, and a cylindrical center portion 306. When assembled, the center portion 306 is located between the first end portion 302 and the second end portion 304 as shown in FIG. 3A. A sealed wave coupler chamber 307 is defined by the interior surface of the center portion 306 and the tapered interior surfaces 305, 305' of the first and second end portions 302, 304.

Figure 3C:
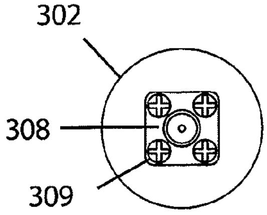
FIG. 3C is a side perspective view of the isolation device of FIG. 3A.

Isolation device 306 further includes one or more connectors, such as first connector 308 and second connector 310. The depicted connectors 308, 310 are bulkhead mount coaxial connectors that are coupled to the first and second end portions 302, 304 via fasteners 309 as shown. FIG. 3C is a side view of the isolation device 300 of FIG. 3A better depicting how fasteners 309 couple connector first connector 308 to first end portion 302. As discussed above, in alternative embodiments, other types of connectors may be used or integrally formed with isolation device such that fasteners may not be needed.

Figure 3B:
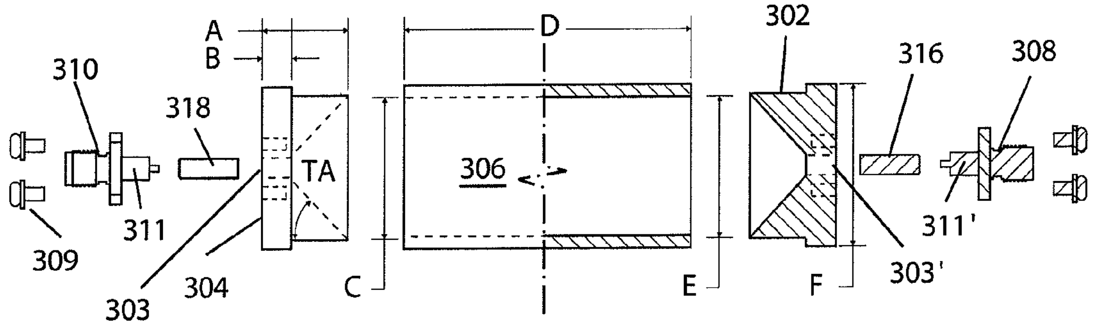
FIG. 3B is an exploded section view of the isolation device of FIG. 3A, with the dielectric portion removed for illustration purposes.

FIG. 3B is an exploded and partially sectioned view of the isolation device 300 of FIG. 3A. The depicted exploded view illustrates the manner in with the center portion 306 receives the first and second end portions 302, 304. In some embodiments, the first and second end portions 302, 304 may be welded, brazed, screwed to, or otherwise permanently affixed to the center portion 306 during manufacture and assembly of the isolation device 300. In this regard, a generally gas tight protective housing may be formed. Once again, although not shown, in one embodiment, the protective housing of FIGS. 3A and 3B may be equipped with external threads for mounting to a reciprocally configured aperture of the environmental enclosure.

FIG. 3B further illustrates one example assembly method for the waveguide transmission/reception couplers 316, 318. In the depicted embodiment, couplers 316, 318 are coupled (e.g., soldered) to the center conductors (e.g., copper core) of the first and second connectors 308, 310. In the depicted embodiment, insulating sleeves 311', 311 enclose the center conductors of the first and second connectors 308, 310. The coupler/connector assemblies are each inserted into apertures 303', 303 defined by the first and second end portions 302, 304. Importantly, in the depicted embodiment, the insulating sleeves 311', 311 are seated fully within the apertures 303', 303 such that only the insulating sleeves 311', 311, and not the couplers 316, 318, contact the walls of the apertures 303', 303 thereby preventing undesirable shorting of the depicted waveguide. As discussed below in connection with FIG. 6, other wave coupler structures may accommodate grounding of one or more couplers.

Figure 3D:
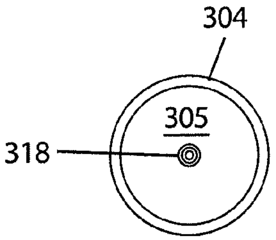
FIG. 3D is an interior view of a second end portion of the isolation device shown in FIG. 3B.

FIG. 3D is a detail view of the second end portion 304 of FIG. 3A illustrating the inner concave or tapered surface 305 and a launch/receive coupler 318. In the depicted embodiment, the tapered surface 305 defines a taper angle TA of 45 degrees as shown in the section view provided by FIG. 3B. The depicted taper angle TA may assist in broadening the bandwidth of the depicted waveguide (which is one exemplary wave coupler as discussed herein). In alternative embodiments, the taper angle TA may be modified to enhance or tune the performance of the depicted waveguide. In still other embodiments, no taper may be needed for acceptable wave coupler performance.

Figure 3E:
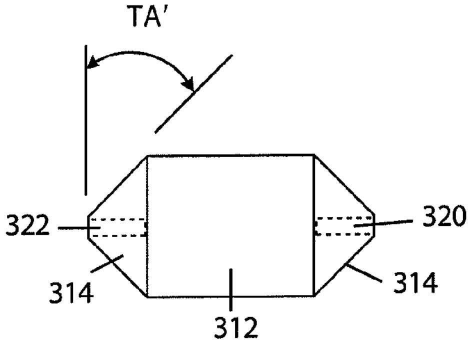
FIG. 3E is a perspective view of a dielectric used in the isolation device of FIG. 3A.

FIG. 3E is a detail view of a dielectric 312 structured to conform to the wave coupler depicted in FIGS. 3A-3B. The depicted dielectric 312 defines a cylindrical center with convex, flat-tipped conical ends 314. The convex or tapered ends of the dielectric 312 conform to concave cavities defined proximate the launch/receive couplers in the first and second end portions. Indeed, in depicted embodiment, the tapered ends 314 of the dielectric define a taper angle TA' that substantially corresponds to the taper angles TA of the first and second end portions. Cavities 320, 322 are defined at opposite ends of the dielectric 312 for receiving the couplers.

Referring collectively to FIGS. 3A and 3B, in one embodiment, the depicted isolation device 300 operates as follows. An input signal generated by an isolated component (not shown) is transmitted via a coaxial cable to first connector 308. The signal passes from the first connector 308 to transmission coupler 316, which launches one or more electromagnetic waves into the sealed wave coupler chamber 307. The electromagnetic waves propagate down 307 and are received by reception coupler 318. The reception coupler 318 then transmits a coupler output signal (e.g., safe or non-destructive signal that is derived from or a component of the input signal generated by the isolated component) to the second connector 310 for eventual transmission to the exposed component (not shown). In other embodiments, signals may proceed in the opposite direction with the input signal being generated at the exposed component (not shown) and the coupler output signal being transmitted from the isolation device to the isolated component.

Isolation devices structured in accordance with various embodiments discussed herein may enjoy one or more of the following benefits when compared to capacitive block circuit isolators of the type disclosed by U.S. Pat. No. 7,057,577: (1) less signal loss due to the absence of a PCB or capacitor, (2) no need to procure highly specialized (i.e., expensive) capacitors, (3) potentially reduced performance variation as there are fewer design/manufacturing variables to contend with, (4) better isolation voltage, (5) potential lower cost solution in many applications, (6) better extensibility, i.e., design can more easily be used for signals at high frequencies, and (7) better immunity to high power/high frequency events.

Figure 4:
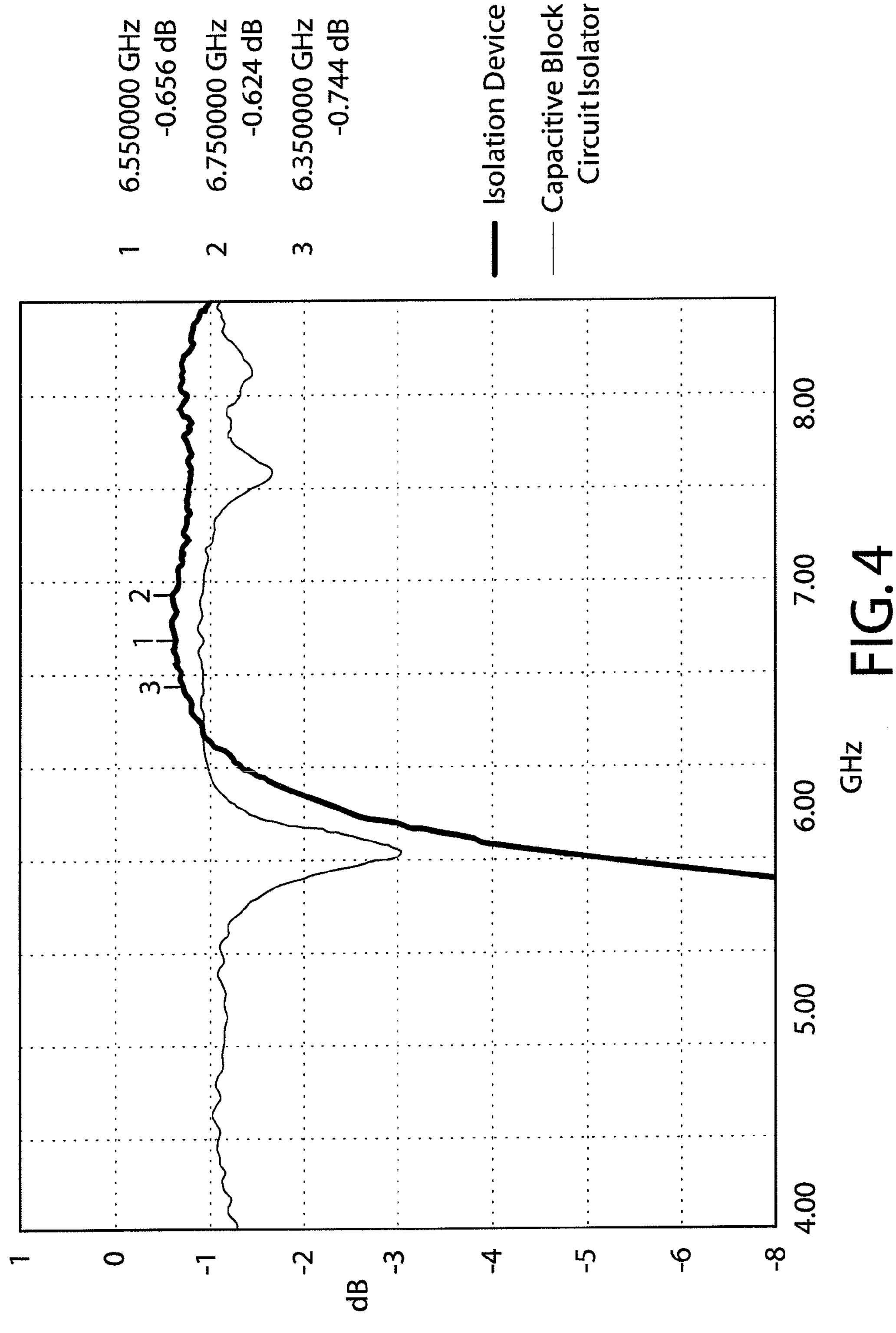
FIG. 4 is a graph illustration of exemplary test results provided to illustrate an improved signal loss, within a desired frequency range, of the isolation device of FIG. 2A/2B.

FIG. 4 is a graph illustration of exemplary test results provided to illustrate the improved signal loss, at a desired frequency range, of the isolation device of FIG. 2A/2B as compared to a highly optimized capacitive block circuit isolator structured in accordance with the known prior art. FIG. 4 illustrates tested signal loss in decibels (dB) versus frequency (Hz) for each of the test samples. Samples were tested using a Wiltron 37269β network analyzer.

In the depicted embodiment, the frequency range of interest is between 6 and 7 GHz. Notably, the isolation device structured in accordance with embodiments herein described produced a signal loss that is lower than that of the capacitive block circuit isolator for most of the operating band between 6 and 7 GHz and, more specifically, between 6.3 and 7 GHz. Accordingly, for high frequency applications between 6.3 GHz and 7 GHz, an isolation device structured according to embodiments herein described may be preferred to limit signal losses and improve communication performance.

Various embodiments of the present invention are not limited to use for frequencies between 6 and 7 GHz. Instead, as will be apparent to one of ordinary skill in the art, isolation devices structured according to embodiments herein described may comprise wave couplers that are tuned to a variety of targeted frequencies.

Figure 5A:
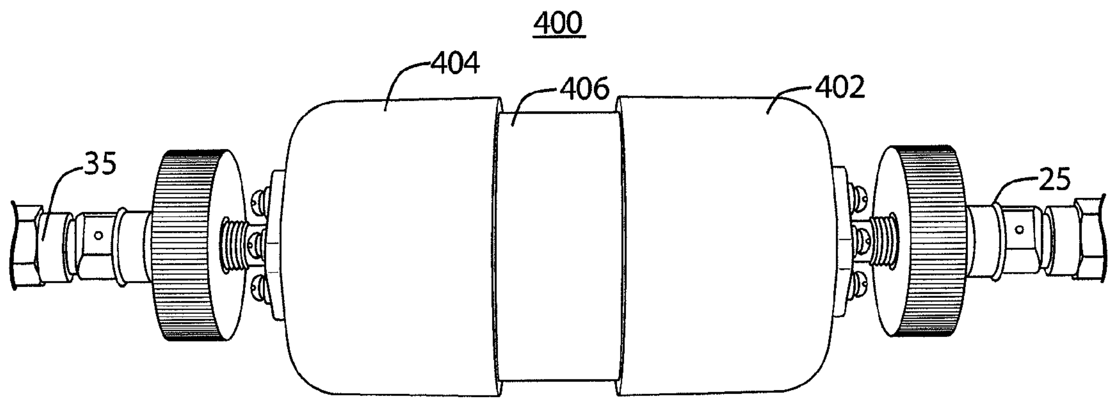
FIG. 5A is a perspective view of an isolation device structured in accordance with some embodiments discussed herein.
Figure 5B:
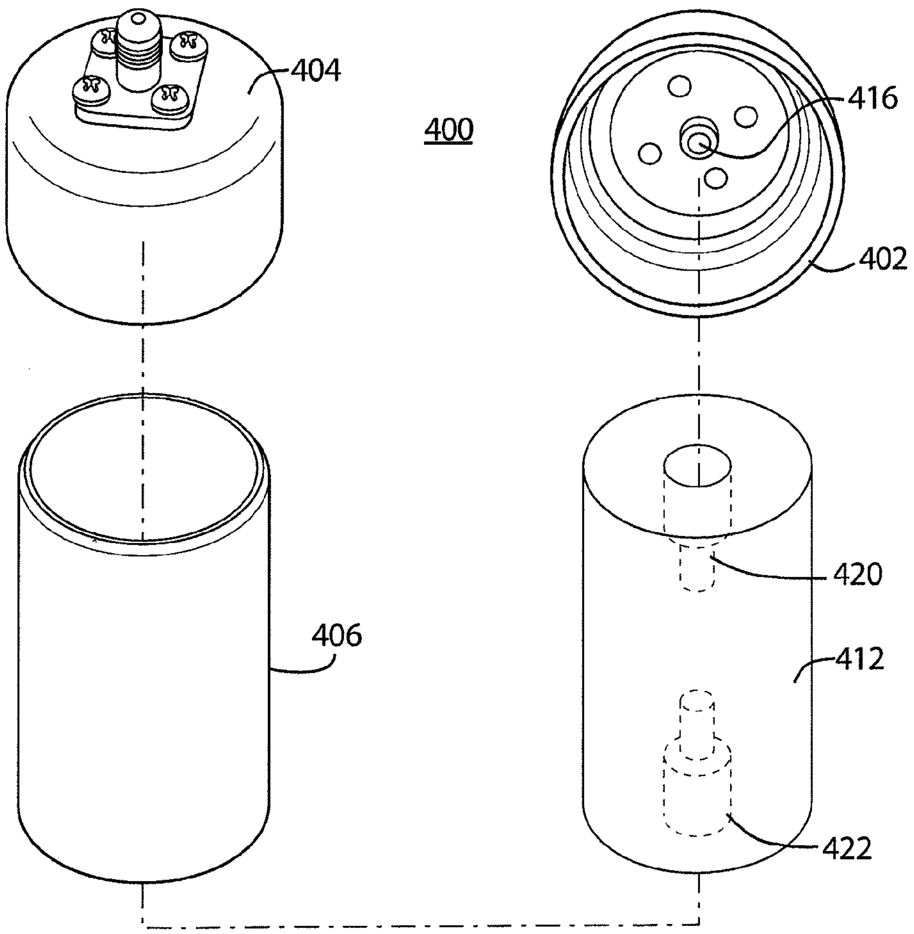
FIG. 5B is an exploded view of the isolation device of FIG. 5A.

FIGS. 5A and 5B show isolation device 400, which is structured in accordance with yet another embodiment. Isolation device 400, similar to isolation device 300 of FIGS. 2A and 2B, is an example of an isolation device that may be removably connected to an environmental enclosure, such as environmental enclosure 108 of FIG. 1A. Isolation device 400 may be a waveguide as shown or a different type of wave coupler that is filled with one or more suitable dielectric materials (such as one or more of those discussed in connection with dielectric 312 of FIG. 2B) and is used to provide isolation of hazardous signals and/or environments from potentially dangerous conditions created in the environmental enclosure (or vice-versa).

FIG. 5A shows first coaxial cable 25 and second coaxial cable 35 coupled to isolation device 400. More specifically, FIG. 5A shows first coaxial cable 25 electromechanically coupled to first end portion 402 of isolation device 400 and second coaxial cable 35 electromechanically coupled to second end portion 404. Isolation device 400 also includes center portion 406. First end portion 402 and second end portion 404 extend at least partially over and receive center portion 406 as shown in FIG. 5A. Each of these components may be brazed or otherwise permanently coupled together to form a gas tight protective housing as discussed above. Each of these components may also combine to define a wave coupler chamber in accordance with various embodiments herein described.

FIG. 5B shows an example of isolation device 400 with first end portion 402, second end portion 404 and center portion 406 separated from each other. One or more internal components, such as dielectric 412 shown in FIG. 5B, may also be included inside some embodiments of isolation device 400. Dielectric 412 can comprise a potting resin or epoxy encapsulant that conforms to the internal shapes and structures of isolation device 400. One or more other gasses, liquids and/or any other internal components may also or instead be placed inside isolation device 400. As noted in reference to FIG. 2B, a potting resin and/or other shape-conforming dielectric may be advantageous when there are complex internal structures and/or other aspects of isolation device (such as, e.g., ribs, etc.) and/or when there is a need to be gas tight to a very high pressure to prevent, e.g., forces caused by an explosion inside the protective housing from being released into a hazardous or an explosive environment. Additionally, a potting resin and/or other dielectric may enable isolation device to be smaller than, for example, if air is used as the dielectric.

While dielectric 412 may be any suitable shape, in FIG. 5B dielectric 412 is shown as having a cylindrical shape with flat ends. Dielectric 412 can also be configured to conform to/accommodate couplers, such as coupler 416 of first end portion 402. In some embodiments, dielectric 412 may include cavities 420, 422 into which couplers, such as coupler 416, can be situated when isolation device 400 is assembled as shown in FIG. 5A. As noted above, the couplers and/or cavities 420, 422 of isolation device 400 can be any suitable size and shape, including that of a loop, among others. Although coupler 416 is shown as being relatively smaller than those shown in FIG. 5B, one or more of the couplers of isolation device 400 may be configured and/or function the same as or similar to those discussed in reference to, e.g., FIGS. 2A and 2B. Additionally, isolation device 400 can be comprised of one or more suitable materials, such as those discussed above in reference to, e.g., FIGS. 2A and 2B. For example, first end portion 402, second end portion 404 and center portion 406 may be at least mostly comprised of silver-plated brass, copper and/or other conductive material(s).

FIG. 6 is a schematic illustration of an isolation device 500 having a resonant cavity wave coupler structured in accordance with another embodiment of the invention. The depicted isolation device 500 comprises a wave coupler, and more particularly, a resonant cavity, for transmitting signals across the isolation device 500 while ensuring that such signals are of a type sufficient to avoid causing sparks or other undesirable effects.

The isolation device 500 comprises body cavity 506 that serves as a protective housing and a first connector 508 and a second connector 510. The first connector 508 and/or second connector 510 may be configured to receive an input signal generated by an isolated component (not shown) or an exposed component (not shown). For example, first connector 508 may function as an input port that receives an input signal from a cable (such as a coaxial cable) or other signal carrying medium connected thereto. The signal carrying medium may, in one example, be connected to isolated components, such as isolated components 106 of FIG. 1A.

Isolation device 500 can be configured (i.e., constructed and tuned) to coupler out signals that satisfy one or more predetermined requirements (e.g., signals within a predetermined frequency range, wavelength range, etc.). If the input signal received by first connector 508 satisfies the one or more requirements and, e.g., is unlikely to ignite the explosive environment, the input signal or a derivative of the input signal (e.g., a filtered portion of the received signal, a less dangerous signal, and/or any other type of signal derived from or analogous to the received signal) can be outputted as coupler output signals from second connector 510 (i.e., coupler output signal) to another cable (such as a second coaxial cable) or other signal carrying medium, which may be configured to carry the signal to the exposed component (e.g., an antenna). In alternative embodiments, the isolation device 500 may operate similarly for signals passing in the opposite direction (i.e., from the exposed component through the isolation device and to the isolated components). The isolation device 500 can be configured to pass only coupler output signals that have one or more characteristics that are suitable (e.g., within a predetermined frequency band and hence are presumed to be safe and nondestructive) to limiting risk associated with electrical communications occurring within an explosive environment.

The depicted isolation device 500 includes a first coupler 516 and a second coupler 518 that each form loops. The loops are disposed in electrical communication with the first and second connectors 508, 510, respectively. Each loop coupler extends from its respective connector 508, 510 through an insulating sleeve or bushing, which prevents shorting (proximate the connector), that is seated within an aperture (not shown) of the conductive wall of the body cavity 506 and into the wave coupler chamber 507 as shown. The loops are then coupled to (i.e., grounded against) the inner wall of the wave coupler chamber 507 (proximate tuning capacitors 565, 560) as shown. In one embodiment, the direct current short-to-ground structure of the loop-type couplers 516, 518 enhance the isolation performance of the device for low-frequency signals above and beyond the mere separation of input and output signals. Such loop structures also may desirably provide a discharge path for static build-up.

The depicted isolation device 500 further comprises a resonator 550 and a tuning adjustment mechanism 555. Additional tuning capacitors 560, 565 may also be used. As will be apparent to one of ordinary skill in the art in view of this disclosure, the tuning adjustment mechanism is structured to extend or retract the resonator 550, and in combination with one or more optional tuning capacitors 560, 565, may operate to tune the operating frequency of the circuit. Various aspects of the wave coupler chamber 507 may also be configured or tuned in order to reduce signal loss and to properly configure the wave coupler for its filter function.

In various embodiments, a potting resin, epoxy encapsulant, or other similar dielectric material may be poured as a liquid or semi-solid into the wave coupler chamber 507 thereby conforming to its internal shape. Potting resins or epoxy encapsulants may be useful in isolation device embodiments that, for example, need to be gas tight to very high pressures. In such embodiments, the potting resins or epoxy encapsulants may assist in ensuring that the protective housing is gas tight and may further enhance the explosion proof capabilities by the housing. In still other embodiments, the wave coupler of the isolation device 500 may be filled with gases such as air, nitrogen, argon, and the like.

Many modifications and other embodiments of the inventions set forth herein will come to mind to one skilled in the art to which these inventions pertain having the benefit of the teachings presented in the foregoing descriptions and the associated drawings. For example, while some examples discussed herein are related to isolation devices comprising cylindrical or otherwise rounded waveguide components, one skilled in the art would appreciate that other types of waveguides as well as other types of devices may be used in accordance with embodiments discussed herein. Therefore, it is to be understood that the inventions are not to be limited to the specific embodiments disclosed and that modifications and other embodiments are intended to be included herein. Although specific terms are employed herein, they are used in a generic and descriptive sense only and not for purposes of limitation.

That which is claimed is:

1. An isolation device disposed in electrical communication between an isolated component and an exposed component, the isolation device comprising:

a protective housing comprising a wave coupler chamber, wherein the protective housing comprises a base metal having a first conductivity and a conductive interior surface having a second conductivity, wherein the second conductivity is greater than the first conductivity;

a transmission coupler positioned within the wave coupler chamber, wherein the transmission coupler is configured to transmit an electromagnetic wave into the wave coupler chamber following receipt of an input signal generated by one of the isolated component or the exposed component; and a reception coupler positioned within the wave coupler chamber, wherein the reception coupler is configured to transmit a coupler output signal to the other of the isolated component or the exposed component upon receipt of the electromagnetic wave.

2. The isolation device of claim 1, further comprising a dielectric at least partially filling the wave coupler chamber.

3. The isolation device of claim 2, wherein the dielectric is an epoxy resin.

4. The isolation device of claim 2, wherein the dielectric substantially completely fills the wave coupler chamber.

5. The isolation device of claim 2, wherein the dielectric is a potting compound.

6. The isolation device of claim 1, wherein the conductive interior surface defines the wave coupler chamber.

7. The isolation device of claim 1, wherein the protective housing defines the wave coupler chamber.

8. The isolation device of claim 1, wherein the housing of the isolation device and the isolated component are enclosed within an environmental enclosure.

9. The isolation device of claim 1, wherein the isolated component is enclosed within an environmental enclosure, and wherein the protective housing of the isolation device is mounted to the environmental enclosure such that a first portion of the housing extends within the environmental enclosure and a second portion of the housing extends outside of the environmental enclosure.

10. The isolation device of claim 9, wherein the protective housing defines external threads that are configured to engage the environmental enclosure.

11. The isolation device of claim 1, wherein isolation device is configured to transmit the coupler output signal at a frequency between 4 GHz and 8 GHz.

12. The isolation device of claim 1, wherein isolation device is configured to transmit the coupler output signal at a frequency between 6 GHz and 7 GHz.

13. The isolation device of claim 1, wherein isolation device is configured to transmit the coupler output signal at a frequency between 6.3 GHz and 7 GHz.

14. The isolation device of claim 1, wherein isolation device is configured to transmit the coupler output signal at a signal loss of less than 0.7 dB, when compared to the input signal, at a frequency between 6.3 GHz and 7 GHz.

15. The isolation device of claim 1, wherein the isolation device is configured to transmit the coupler output signal to at least one of the exposed component positioned within an explosive environment or the isolated component positioned within an environmental enclosure.

16. The isolation device of claim 15, wherein the isolation device is configured to remove aspects of the input signal that may cause ignition of the explosive environment when generating the coupler output signal.

17. The isolation device of claim 1, wherein the wave coupler chamber forms part of a waveguide.

18. The isolation device of claim 1, wherein the wave coupler chamber forms part of a resonant cavity.

19. An isolation device disposed in electrical communication between an isolated component positioned within an environmental enclosure and an exposed component positioned outside the environmental enclosure, the isolation device comprising:

a protective housing comprising a wave coupler chamber, wherein the protective housing comprises a base metal having a first conductivity and a conductive interior surface having a second conductivity, wherein the second conductivity is greater than the first conductivity;

a transmission coupler positioned within the wave coupler chamber, wherein the transmission coupler is configured to transmit an electromagnetic wave into the wave coupler chamber following receipt of an input signal generated by one of the isolated component or the exposed component;

a reception coupler positioned within the wave coupler chamber, wherein the reception coupler is configured to transmit a coupler output signal to the other of the isolated component or the exposed component upon receipt of the electromagnetic wave; and a dielectric at least partially filling the wave coupler chamber.

20. The isolation device of claim 19, wherein the protective housing defines external threads that are configured to engage the environmental enclosure.

* * * * *